United States Patent
Maeda et al.

(10) Patent No.: US 7,064,891 B2
(45) Date of Patent: Jun. 20, 2006

(54) OPTICAL WAVELENGTH CONVERTER WITH A SEMICONDUCTOR OPTICAL AMPLIFIER

(75) Inventors: Yoshinobu Maeda, Yokkaichi (JP); Takahiro Ichikawa, Nagoya (JP)

(73) Assignees: Japan Science and Technology Agency, Kawaguchi (JP); Nihon Yamamura Glass Co., Ltd., Hyogo (JP); Yoshinobu Maeda, Yokkaichi (JP)

( * ) Notice: Subject to any disclaimer, the term of this patent is extended or adjusted under 35 U.S.C. 154(b) by 283 days.

(21) Appl. No.: 10/381,890

(22) PCT Filed: Apr. 1, 2002

(86) PCT No.: PCT/JP02/03274

§ 371 (c)(1),
(2), (4) Date: Mar. 31, 2003

(87) PCT Pub. No.: WO02/086616

PCT Pub. Date: Oct. 31, 2002

(65) Prior Publication Data

US 2003/0174393 A1 Sep. 18, 2003

(30) Foreign Application Priority Data

Apr. 19, 2001 (JP) .............................. 2001-120758

(51) Int. Cl.
*H04B 10/12* (2006.01)
*G02F 1/00* (2006.01)

(52) U.S. Cl. .................. 359/344; 359/237; 359/238; 359/239; 385/1

(58) Field of Classification Search ............... 359/344, 359/237–239; 385/1
See application file for complete search history.

(56) References Cited

U.S. PATENT DOCUMENTS

| | | | | | |
|---|---|---|---|---|---|
| 5,132,981 | A | * | 7/1992 | Uomi et al. | 372/45 |
| 5,264,960 | A | * | 11/1993 | Glance | 359/344 |
| 5,940,207 | A | * | 8/1999 | Weich et al. | 359/333 |
| 6,040,938 | A | * | 3/2000 | Ducellier | 359/344 |
| 6,101,027 | A | * | 8/2000 | Lee et al. | 359/344 |
| 6,480,316 | B1 | * | 11/2002 | Trumbly | 398/202 |

(Continued)

FOREIGN PATENT DOCUMENTS

JP A 9-138407 5/1997

*Primary Examiner*—Jack Keith
*Assistant Examiner*—Eric Bolda
(74) *Attorney, Agent, or Firm*—Oliff & Berridge, PLC

(57) ABSTRACT

An optical function device capable of controlling an optical signal with another optical signal, wherein a modulated input light $I_{in}$ of a wavelength $\lambda_1$ is coupled with a bias light $I_{bias}$ of a wavelength $\lambda_2$, and the thus coupled input and bias lights are input to a first semiconductor optical amplifying element 48, so that the bias light Ibias is intensity-modulated in a phase reversed with respect to the input light $I_{in}$, while the input light $I_{in}$ is cut by a first wavelength extracting element 56. A control light $I_c$ of the wavelength $\lambda_1$ is coupled with the intensity-modulated bias light $I_{bias}$ of the wavelength $\lambda_2$, and the thus coupled control and bias lights are input to a second optical amplifying element 50, so that the once reversed bias light $I_{bias}$ of the wavelength $\lambda_2$ is intensity-modulated with respect to the control light $I_c$ of the wavelength $\lambda_1$, and is extracted as an output light by a second wave extracting element 50. The optical function device functions as a three-terminal optical computing and amplifying device, a three-terminal optical switching device or an optical DEMUX device, which is capable of controlling an optical intensity by using one wavelength and which permits multi-stage connection.

13 Claims, 12 Drawing Sheets

U.S. PATENT DOCUMENTS 6,577,435 B1 * 6/2003 Bang et al. .................. 359/326
6,731,427 B1 * 5/2004 Wu ............................. 359/344
6,950,233 B1 * 9/2005 DiJaili et al. ................ 359/344
2002/0176152 A1 * 11/2002 Parolari et al. ............. 359/326

* cited by examiner

OPTICAL WAVELENGTH CONVERTER WITH A SEMICONDUCTOR OPTICAL AMPLIFIER

TECHNICAL FIELD

The present invention relates to an optical function device for amplification, control or switching of optical signals, and more particularly to an optical control device suitable for photoelectronics such as optical communication, optical image processing, optical computation, optical measurement and optical integrated circuits, which are capable of advanced information processing.

BACKGROUND ART

There have been demanded extensive developments of broad-band services such as dynamic image communication and picture image transmission or distribution, using fiber-optic communication capable of broad-band efficient data transmission or transfer. In electronics, for example, there have not yet been realized functional elements (active elements) equivalent to triode transistors, that is, optical function devices capable of controlling an optical signal directly with another optical signal.

Actually, therefore, an optical signal that has been transmitted at a high-speed is once converted into an electrical signal, which is subjected to data processing in an electronic circuitry, and the processed data signal is then reconverted into an optical signal to be transmitted. This incapability to achieve direct control of an optical signal with another optical signal has limited the efficiency of optical signal processing. If a data signal can be processed as received in the form of an optical signal, it is considered possible to perform parallel processing operations, which are expected to permit further reduction in the required signal processing time.

The present invention was made in the light of the background art described above. It is an object of the present invention to provide an optical function device which permits processing of an optical signal directly with another optical signal.

DISCLOSURE OF INVENTION

In the light of the background art described above, the present inventor has made extensive studies, and found out that an optical function element or device can be suitably constructed based on a phenomenon that where input laser lights of predetermined wavelengths, for example, a first laser light of a wavelength $\lambda_1$ and a second laser light of a wavelength $\lambda_2$ are input to a semiconductor optical amplifying element, a variation in the intensity of the second laser light causes a variation in the intensity of the first laser light in response to the variation in the intensity of the second laser light, while the variation in the intensity of the first laser light is reversed with respect to the variation in the second laser light. The present invention was made on the basis of the finding described above.

That is, there is provided according to the invention an optical function element characterized by comprising: (a) a semiconductor optical amplifying element operable to intensity-modulate one of a plurality of input laser lights having respective different wavelengths, in a phase reversed with respect to another of the input laser lights; (b) a wavelength extracting element operable to extract the wavelength of the above-indicated one laser light, to output an output light; and (c) an optical feedback element operable to effect positive feedback of a portion of the output light to an input end of said semiconductor optical amplifying element.

In the optical function element described above, one of the plurality of input laser lights input to the semiconductor optical amplifying element is intensity-modulated in a phase reversed with respect to another of the input laser lights, and only the above-indicated one input laser light is extracted and output as the output light by the wavelength extracting element. At the same time, a portion of the output light is subjected to the positive feedback to the input end of the semiconductor optical amplifying element. Thus, the present optical function element is capable of switching or otherwise controlling a laser light of one wavelength by using the other wavelength, or amplifying the laser light of the other wavelength to generate an output light of the one wavelength, so that data processing can be effected in the form of the optical signals, permitting high data processing efficiency, and an increase in the ratio of signal modulation of the output light, leading to an increased S/N ratio.

Preferably, the semiconductor optical amplifying element is constituted by a mixed crystal semiconductor of Groups III–V, such as InGaAs, InGaAsP, AlGaAs or InGaAlN. In this case, the semiconductor optical amplifying element can be small-sized, and has a high ratio of amplification. In addition, the wavelength of the light to be amplified can be selected as desired, by suitably determining the proportion (mixing ratios) of the elements of the mixed crystal semiconductor.

Preferably, the above-indicated semiconductor optical amplifying element includes an optical waveguide for guiding the laser lights, and an active layer formed within the optical waveguide so as to extend in a wave guiding direction and providing a pn-junction portion, and is arranged to receive an energy to excite the active layer. In this semiconductor optical amplifying element, the optical amplification is effected by the active layer formed within the optical waveguide provided in a portion of the amplifying element so as to extend in the wave guiding direction. Accordingly, the present semiconductor optical amplifying element can be made smaller in size and has a higher energy conversion efficiency, than an optical amplifier constituted by an optical fiber doped with a rare-earth element such as erbium.

Preferably, the active layer is constituted by a bulk, a quantum well, a strained superlattice or a quantum dot of a mixed crystal semiconductor of Groups III–V, such as InGaAs, InGaAsP, AlGaAs or InGaAlN. Where the active layer takes the form of the quantum well, strained superlattice or quantum dot, the active layer has particularly high response and gain and a particularly high ratio of modulation of the output light.

Preferably, the wavelength extracting element is constituted by any one of: a grating filter formed by a portion of an optical waveguide constructed to guide the output light of the semiconductor optical amplifying element, which portion has a refractive index that is periodically changed in a wave guiding direction; a multi-layered filter which is a laminar structure consisting of multiple sets of layers which have respective different refractive index values; a light absorbing material; and a photonic crystal having a photonic band gap. In this case, the wavelength extracting element is provided in a portion or at an end face of the optical waveguide of the semiconductor optical amplifying element, so that the optical function element can be further small-sized.

Preferably, the optical feedback element is constituted by any one of: a grating filter formed by a portion of an optical waveguide constructed to guide the output light of the semiconductor optical amplifying element, which portion has a refractive index that is periodically changed in a wave guiding direction; a multi-layered filter which is a laminar structure consisting of multiple sets of layers which have respective different refractive index values; a photonic crystal having a photonic band gap; and a layer to reduce light reflection from an output end face of the wavelength extracting element. In this case, the optical feedback element is provided in a portion of the optical waveguide provided to guide the output light of the optical amplifying element, so that the optical function device can be made smaller in size, than where an optical fiber is used to feedback a portion of the output light.

Preferably, an optical function device of this invention comprises a plurality of optical function elements described above and connected in series with each other, and an optical coupler disposed between the two optical function elements of the above-indicated plurality of optical function elements and operable to couple together an output light of a downstream one of the two optical function elements and an input laser light having a wavelength equal to or different from the wavelength of the output light, and input the coupled output light and input laser light to an upstream one of the two optical function elements. This optical function device functions as a three-terminal optical computing and amplifying device, a three-terminal optical switching device or an optical DEMUX (demultiplexer) device. The optical function device including the plurality of the optical function elements connected in series with each other can be used as the three-terminal optical computing and amplifying device, three-terminal optical switching device or optical DEMUX device (signal separating circuit). For instance, the optical function device can effect a switching control by using a laser light of one wavelength for each pair of optical function elements, or by amplifying a laser light of another wavelength to generate an output light of the one wavelength. Thus, the present optical function device can effect multi-stage data processing operations using a laser beam of one wavelength.

BEST MODE FOR CARRYING OUT THE INVENTION

Figure 1:
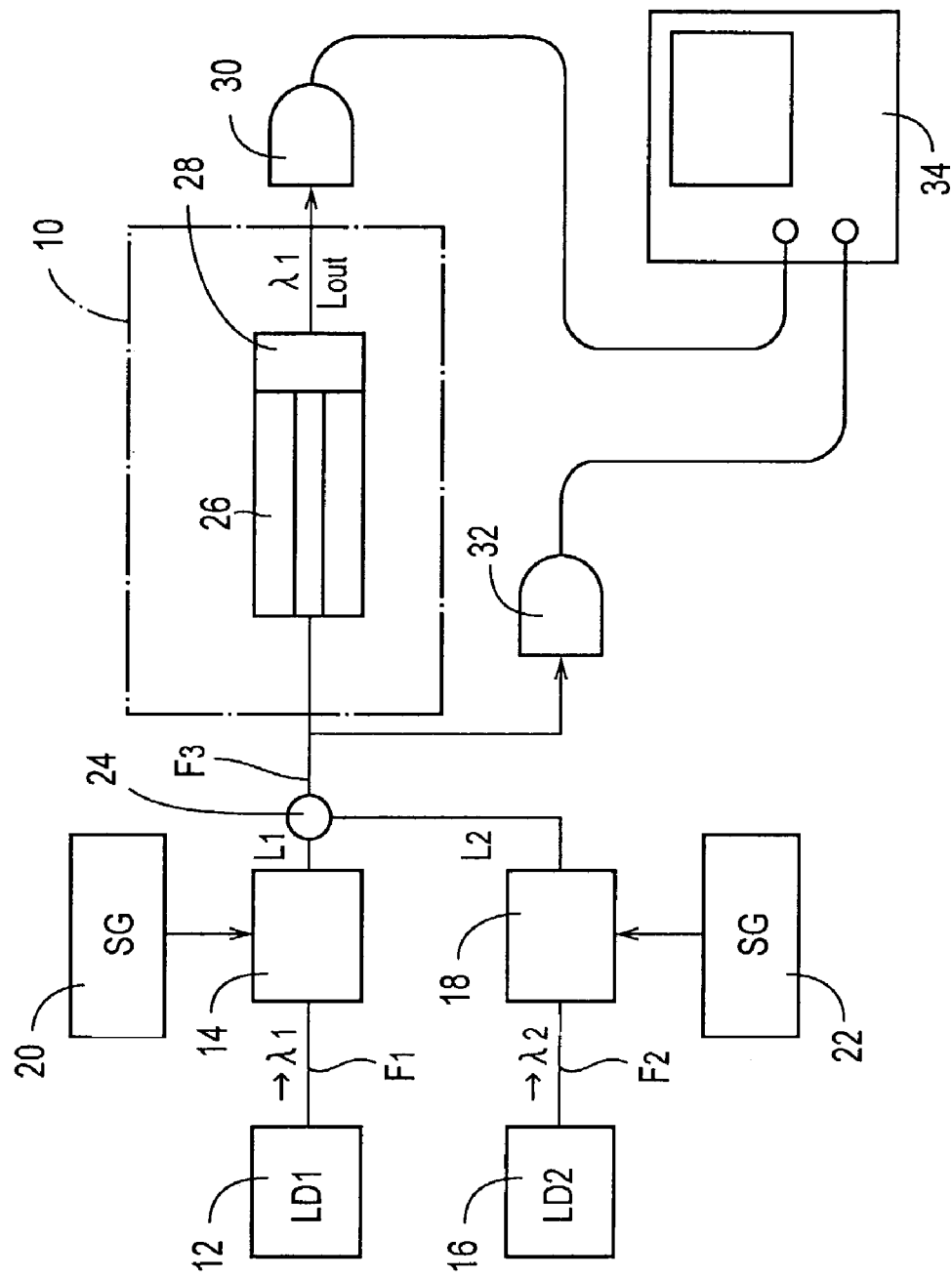
FIG. 1 is block diagram illustrating an arrangement of an optical function element according to one embodiment of the present invention.

Referring to the drawings, there will be described in detail an optical function (control) element 10 according to one embodiment of this invention.

FIG. 1 is a view schematically illustrating an arrangement of the above-indicated optical function element. In FIG. 1, there is shown a first laser light source 12, which is arranged to generate a first laser light $L_1$ having a first wavelength $\lambda_1$, for example, 1540 nm, such that the generated first laser light $L_1$ propagates through a first optical fiber $F_1$ to a first optical modulator 14. A second laser light source 16 is arranged to generate a second laser light $L_2$ having a second wavelength $\lambda_2$, for example, 1550 nm, such that the generated second laser light $L_2$ propagates through a second optical fiber $F_2$ to a second optical modulator 18. For instance, the first laser light source 12 and the second laser light source 16 are variable-wavelength semiconductor lasers. The first optical modulator 14 and the second optical modulator 18 are arranged to effect pulse modulation of the laser lights passing therethrough, according to electric signals generated from respective signal generators 20, 22, so that the laser lights are modulated into pulse signals having respective frequencies of the electric signals. An optical coupler 24 connects the above-indicated first optical fiber $F_1$ and second optical fiber $F_2$ to a third optical fiber $F_3$, and couples the first and second laser lights $L_1$, $L_2$ which have propagated through the respective first and second optical fibers $F_1$, $F_2$. The coupled laser lights $L_1$, $L_2$ are input to a semiconductor optical amplifying element 26 through the third optical fiber $F_3$. A wavelength extracting element 28 is connected to the semiconductor optical amplifying element 26, and is arranged to extract a light of the first wavelength $\lambda_1$ of 1540 nm from the light output from the optical amplifying element 26, and output the extracted light as an output light. Those semiconductor optical amplifying element 26 and wavelength extracting element 28 correspond to the optical function device 10 which converts the signal of the second laser light $L_2$ into a signal of the wavelength $\lambda_1$ reversed with respect to the second laser light $L_2$, and directly amplifies the latter signal into the output light. In FIG. 1, there are also shown a pair of photodetectors 30, 32 arranged to monitor the output light $L_{out}$ that has passed through the wavelength extracting element 28, and the coupled first and second laser lights $L_1$, $L_2$, and an oscilloscope 34 for observing optical signals as detected by the photodetectors 30, 32.

Figure 2:
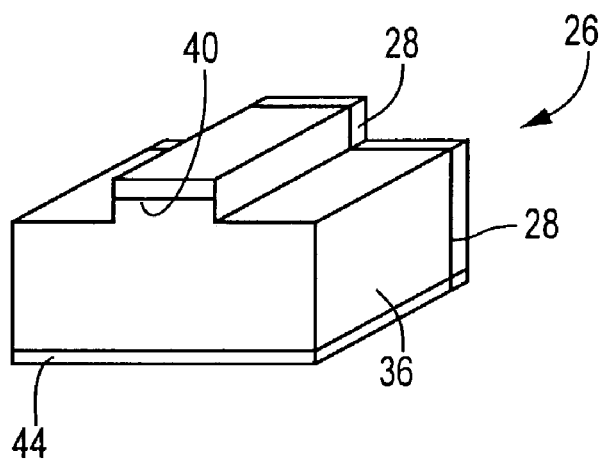
FIG. 2 is a perspective view illustrating an arrangement of a semiconductor optical amplifying element in the embodiment of FIG. 1.
Figure 3:
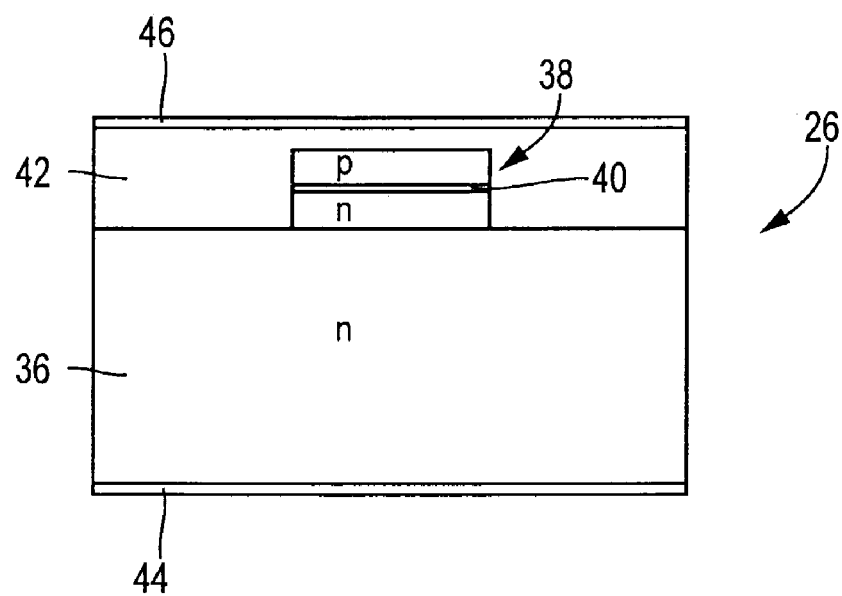
FIG. 3 is a cross sectional view illustrating an arrangement of the semiconductor optical amplifying element in the embodiment of FIG. 1.

The semiconductor optical amplifying element 26 described above is constituted by a mixed crystal semiconductor of Groups III–V, for example, a mixed crystal semiconductor of InGaAsP, which has grown on a substrate 36 of a compound semiconductor such as InP. FIGS. 2 and 3 shows an example of the semiconductor optical amplifying element 26, which includes: an optical waveguide 38 for guiding an input laser light; an active layer 40 which provides a pn-junction portion and which extends in a wave guiding direction or longitudinal direction of the optical waveguide 38; a cap layer 42 grown on a surface of the InP substrate 36 such that the optical waveguide 38 indicated above is embedded in the cap layer 42; and a pair of electrodes 44, 46 bonded to the bottom surface of the InP substrate 36 and the upper surface of the cap layer 42. An energy to excite the active layer 40 is injected into the active layer 40, by applying an electric current between the pair of electrodes 44, 46. The above-indicated optical waveguide 38 is formed by removing, by etching, the opposite lateral end portions of a layer grown on the InP substrate 36, such that the laterally intermediate portion of this layer left on the surface of the InP substrate 36 extends in the wave guiding direction. The optical waveguide 38 is formed of a mixed crystal semiconductor of InGaAsP whose mixing ratios are determined so that the refractive index of the optical waveguide 38 is higher than that of the InP substrate 36. Accordingly, a light propagates through the optical waveguide 38, without scattering in the directions of thickness and width of the InP substrate 36. In the perspective view of FIG. 2 showing the shape of the optical waveguide 38, the cap layer 42 and the electrode 46 bonded to its upper surface are not shown. The cap layer 42 indicated above may be provided with a current blocking structure as needed to concentrate the applied electric current on the active layer 40.

The above-indicated active layer 40 has a multiplex quantum well structure constituted by six pairs of InGaAs barrier layer (100 Å thick) and InGaAsP barrier layer (1.45 μm composition, 100 Å thick) which are grown on the InP substrate 36 and which are lattice-matched with each other. On this active layer 40, there is formed a guide layer (200 Å thick) of GRIN structure whose composition (refractive index) changes in steps. The active layer 40 has a device length (length of the optical waveguide 38) of 600 μm. This active layer 40 is considered to amplify a light passing therethrough, owing to generation of an optical energy from electrons excited by energy injection by application of an electric current of 200 mA, for example, when the electrons are moved to a valence band by induced radiation by photons passing through the active layer 40. The energy injection by application of the electric current of 200 mA provides a gain of about 24 dB as measured at the wavelength of 1.55 μm.

In the optical function element 10, an output light of the semiconductor optical amplifying element 26 has passed through the wavelength extracting element 28 shown in FIG. 1, and a portion of this output light is reflected by the output end face of the wavelength extracting element 28 and returned to the semiconductor optical amplifying element 26. The returned portion of the output light is reflected by the input end face of the semiconductor optical amplifying element 26, and coupled with the input light. The returned portion of the output light is also amplified by the active layer 40, so that the amplification ratio of the output light is increased. That is, a portion of the output light is subjected to positive feedback. In the present embodiment, therefore, the output end face of the wavelength extracting element 28 and the input end face of the semiconductor optical amplifying element 26 cooperate to function as a feedback element. However, the feedback element may be constituted by external mirrors.

The above-indicated wavelength extracting element 28 is constituted by one of a grating filter, a multi-layered filter, a light absorbing material, and a photonic crystal, which are formed integrally with or separately from the semiconductor optical amplifying element 26. The grating filter which is formed by a portion of the optical waveguide 38 constructed to guide the output light of the semiconductor optical amplifying element 26, which portion has a refractive index that is periodically changed in the wave guiding direction. The multi-layered filter which is a laminar structure consisting of multiple sets of layers which are bonded to the output end face of the semiconductor optical amplifying element 26 and which have respective different refractive index values. The light absorbing material absorbs the light of the second wavelength $\lambda_2$ of 1550 nm, so as to extract the light of the first wavelength $\lambda_1$ of 1540 nm. The photonic crystal has a photonic band gap which absorbs the light of the second wavelength $\lambda_2$ or permits transmission of the light of the first wavelength $\lambda_1$. In the specific example shown in FIGS. 1–3, the wavelength extracting element 28 is constituted by the multi-layered filter integrally bonded to the output end face of the semiconductor optical amplifying element 26.

Figure 4:
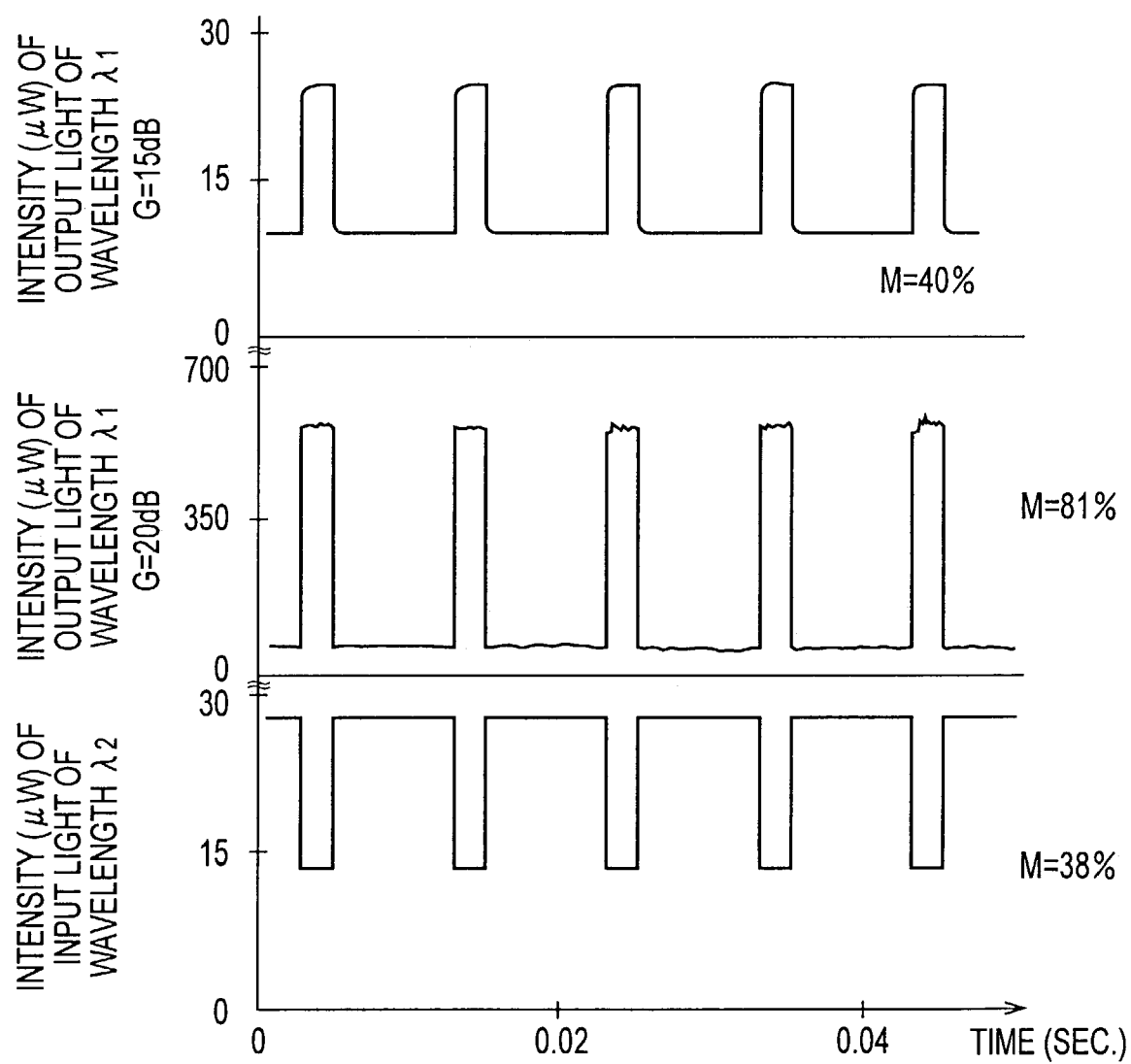
FIG. 4 is a time chart illustrating input and output signals when a portion of an output light is subjected to positive feedback in the embodiment of FIG. 1.
Figure 5:
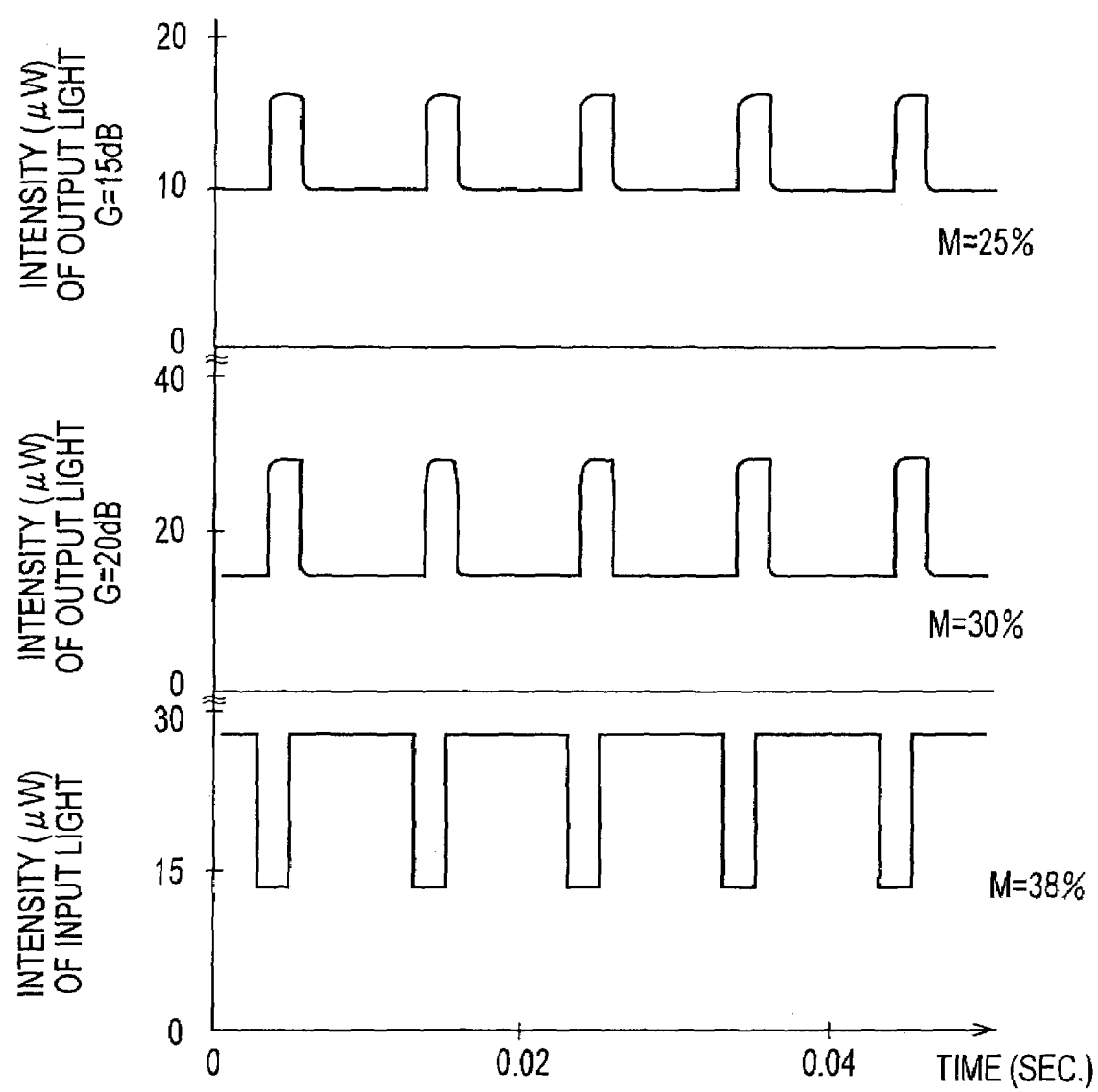
FIG. 5 is a time chart illustrating the input and output signals when the portion of the output light is not subjected to the positive feedback.

In the optical function element 10 of FIG. 1, the second laser light $L_2$ modulated at 1 kHz by the second modulator 18 and the non-modulated first laser light $L_1$ are coupled together and input to the semiconductor optical amplifying element 26. As a result, the 1 kHz input signal (second laser light $L_2$) having the modulation percentage M of 38% in the form of the input light shown in FIG. 4 is amplified into an output light $L_{out}$ in the form of the first laser light $L_1$ of the wavelength $\lambda_1$ also shown in FIG. 4. When the gain G of the semiconductor optical amplifying element 26 is 15 dB, the output signal reversed with respect to input signal has the modulation percentage M of 40%. When the gain G is 20 dB, the reversed output signal has the modulation percentage M of 81%, that is, the input signal is considerably amplified into the optical output signal. The modulation percentage M (%) is represented by $(I_{max}-I_{min})/(I_{max}+I_{min})\times 100$, wherein "$I_{max}$" and "$I_{min}$" represent the maximum and minimum values of the signal waveform, respectively. The gain G of the semiconductor optical amplifying element 26 is determined on the basis of an amount of an energy injected into the semiconductor optical amplifying element 26, for example. FIG. 5 shows a case where the output end face of the wavelength extracting element 28 is covered by a non-reflecting coating, to prevent the positive feedback of a portion of the output light $L_{out}$. Although the modulation ratio of the output light Lout increases with the gain G of the optical amplifying element 26, the modulation percentage M of the output light in the case of FIG. 5 is as low as about 30%.

Figure 6:
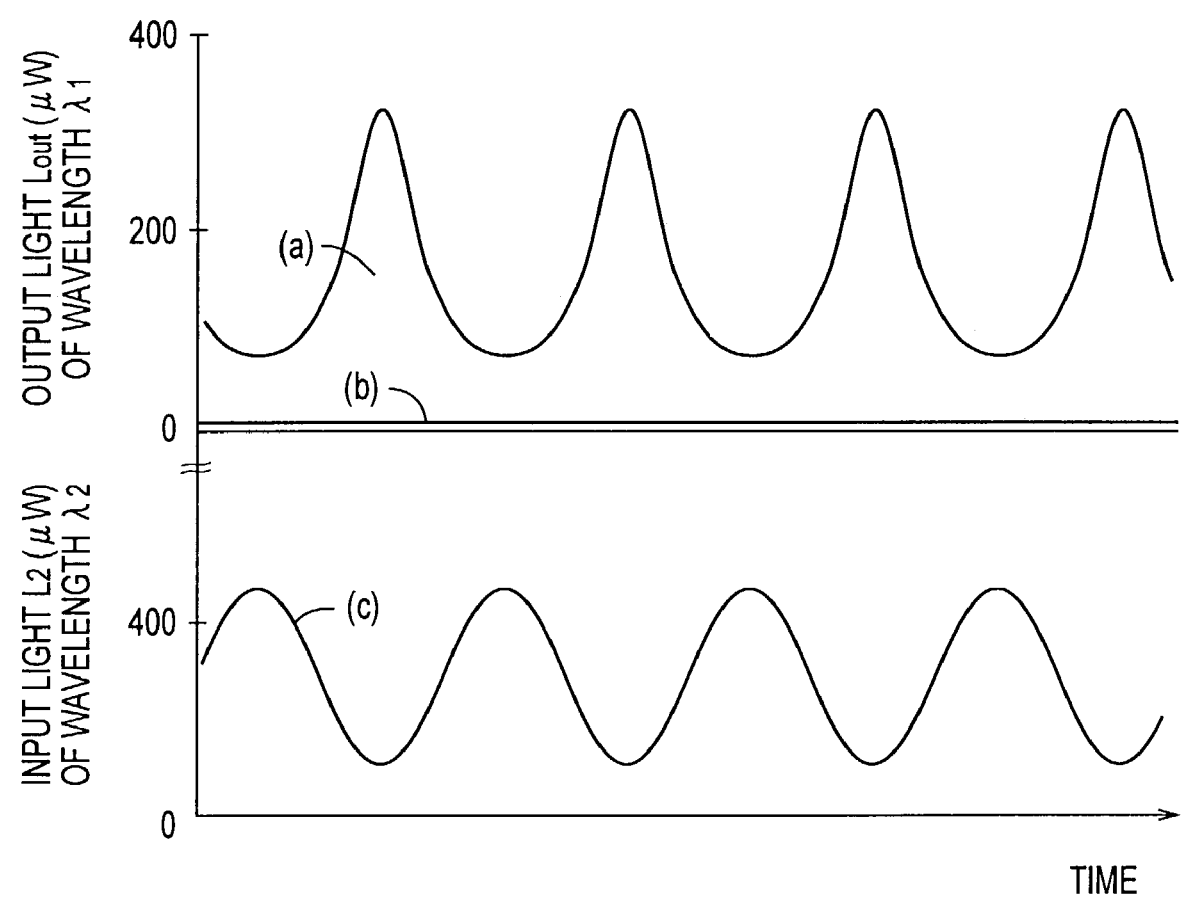
FIG. 6 is a time chart illustrating output signals in the embodiment of FIG. 1, in the case where an input light of a wavelength $\lambda_1$ is input to the element, and in the case where the input light is not input to the element.
Figure 7:
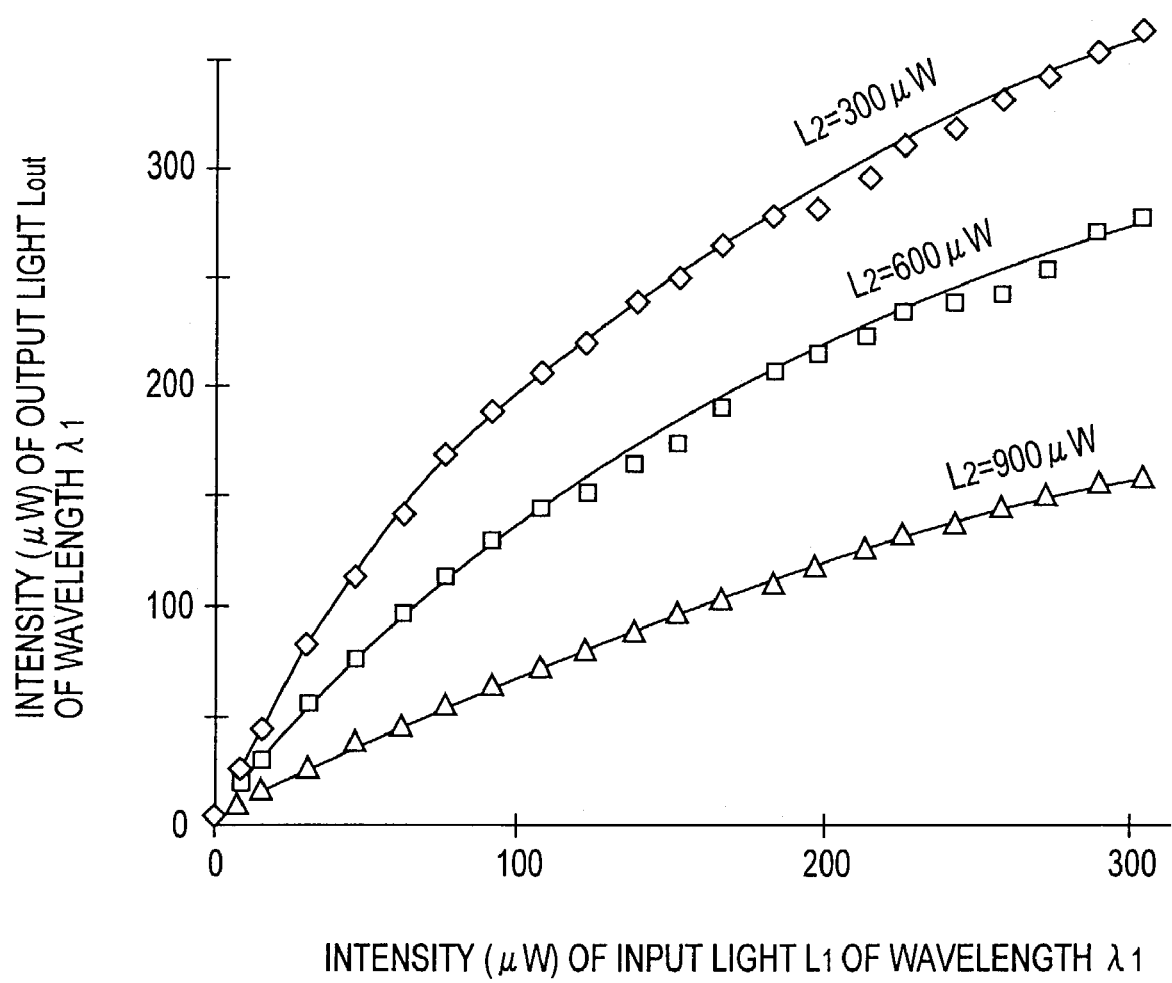
FIG. 7 is a view illustrating input and output characteristics of the optical function element, for different intensities of the input light of the wavelength $\lambda_1$ used as a parameter, in the embodiment of FIG. 1.

FIG. 6 shows a result of an experiment on the switching characteristics of the optical function element 10. More specifically, FIG. 6 shows a change in the waveform of the output light $L_{out}$ observed where the input light of the second wavelength $\lambda_2$ of 1550 nm in the form of the second laser light $L_2$ is modulated at 500 MHz, when the gain G of the semiconductor optical amplifying element 26 is 15 dB. FIG. 6 indicates, at (a), an output waveform $L_{out}$ reversed with respect to the input waveform $L_2$ where the first laser light of the first wavelength $\lambda_1$ of 1540 nm had an intensity of 100 µW, and at (b), an output waveform $L_{out}$ where the first laser light of the first wavelength $\lambda_1$ of 1540 nm was not input to the element 26, while FIG. 6 indicates, at (c), a waveform of the input light of the first wavelength $\lambda_1$ of 1540 nm in the form of the second laser light $L_2$. The output waveform indicated at (a) in FIG. 6 is considerably intensity-amplified with respect to the output waveform indicated at (b). The intensity of the output waveform indicated at (a) was 200 µW, while the intensity of the output waveform indicated at (b) was 10 µW, according to the measurements by an optical power meter. The intensity of the output waveform at (a) is twice as high as the intensity of 200 µW of the first laser light $L_1$ of the first wavelength $\lambda_1$. FIG. 7 shows a change in the intensity of the output light $L_{out}$ with a change in the intensity of the first laser light $L_1$ of the first wavelength $\lambda_1$, for intensities 300 µW, 600 µW and 900 µW of the second laser light $L_2$ of the second wavelength $\lambda_2$.

In the optical function element 10 of the present embodiment including the semiconductor optical amplifying element 26 and the waveform extracting element 28, the second laser light $L_2$ serving as the second input light of the second wavelength $\lambda_2$ is input to the semiconductor optical amplifying element 26, while at the same time the first laser light $L_1$ serving as the first input light of the first wavelength $\lambda_1$ different from the second wavelength $\lambda_2$ is input to the semiconductor optical amplifying element 26 through the optical coupler 24 functioning as a laser input device, so that those second laser light $L_2$ and first laser light $L_1$ are coupled together. A light of the first wavelength $\lambda_1$ is extracted by the wavelength extracting element 28, as the output light $L_{out}$, from the light output from the semiconductor optical amplifying element 26. The amplified signal intensity of the output light $L_{out}$ changes in response to a variation in the signal intensity of the second laser light $L_2$ of the second wavelength $\lambda_2$. Namely, the output light $L_{out}$ is reversed in phase with respect to the input signal in the form of the modulated second laser light $L_2$, but has a signal intensity which is considerably higher than that of the second laser light $L_2$. Thus, the present optical function element is capable of switching or otherwise controlling a laser light of one wavelength by using the other wavelength, or amplifying the laser light of the other wavelength to generate an output light of the one wavelength, so that data processing can be effected in the form of the optical signals, permitting high data processing efficiency, and an increase in the ratio of signal modulation of the output light $L_{out}$ by positive feedback of a portion of the output light $L_{out}$, leading to an increased S/N ratio.

The amplification effect described above is obtained for the desired wavelengths $\lambda_1$ and $\lambda_2$ selected within the wavelength band in which the semiconductor optical amplifying element 26 has an amplification gain G. Further, three or more wavelengths may be used. The semiconductor optical amplifying element 26 of the present embodiment provided with the active layer 40 having the multiplex quantum well structure has an amplification gain G in the wavelength band of about 100 nm, which is about twice that of a semiconductor optical amplifying element whose active layer 40 is in the form of a bulk.

Where the semiconductor optical amplifying element 26 in the present embodiment is constituted by a mixed crystal semiconductor of Groups III–V, such as InGaAs, InGaAsP, AlGaAs or InGaAlN, the optical amplifying device as a whole can be small-sized and is capable of providing a high amplification ratio. In addition, the wavelength to be optically amplified can be selected as desired, by changing the proportion (mixing ratios) of the elements of the mixed crystal semiconductor.

Further, the semiconductor optical amplifying element 26 of the present embodiment includes the optical waveguide 38 for guiding the laser light $L_1$, $L_2$, and the active layer 40 which is formed within the optical waveguide 38 so as to extend in the wave guiding direction and which provides the pn-junction portion. In this semiconductor optical amplifying element 26, the optical amplification is effected by the active layer 40 which is provided within the optical waveguide 38 provided in a part of the element 26, such that the active layer extends in the wave guiding direction. Accordingly, the optical function element 10 or an optical function device 52 which includes the optical function element 10 and which will be described can be further small-sized.

In the present embodiment, the active layer 40 constituted by a mixed crystal semiconductor of Groups III–V such as InGaAs, InGaAsP, AlGaAs or InGaAlN may take the form of a bulk, a quantum well, a strained superlattice or a quantum dot. Where the active layer 40 takes the form of the quantum well, strained superlattice or quantum dot, the active layer 40 has particularly high response and gain G and a particularly high ratio of modulation.

Further, the wavelength extracting element 28 in the present embodiment is constituted by one of: the above-described grating filter formed by a portion (for example, a surface portion) of the optical waveguide 38 constructed to guide the output light $L_{out}$ of the semiconductor optical amplifying element 26, which portion has a refractive index that is periodically changed in the wave guiding direction; the above-indicated multi-layered filter which is a laminar structure consisting of multiple sets of layers which have respective different refractive index values; the above-indicated light absorbing material; and the above-indicated photonic crystal having a photonic band gap. Accordingly, the wavelength extracting element 28 can be provided on a portion or an end face of the optical waveguide 38 of the semiconductor optical amplifying element 26, so that the optical function device can be further small-sized.

In the present embodiment, the optical feedback element for positive feedback of a portion of the output light Lout may be constituted by one of: the above-described grating filter formed by a portion (for example, a surface portion) of the optical waveguide 38 constructed to guide the output light $L_{out}$ of the semiconductor optical amplifying element 26, which portion has a refractive index that is periodically changed in the wave guiding direction; the above-indicated multi-layered filter which is a laminar structure consisting of multiple sets of layers which have respective different refractive index values; the above-indicated photonic crystal having a photonic band gap; and an end face reflection reducing layer. Accordingly, the optical feedback element can be provided as a portion of the semiconductor optical amplifying element 26, and the optical function element 10 or the optical function device 52 can be further small-sized.

Other embodiments of this invention will be described. In the following description, the same reference signs as used in the above embodiment will be used to identify the functionally corresponding elements, which will not be described redundantly.

Figure 8:
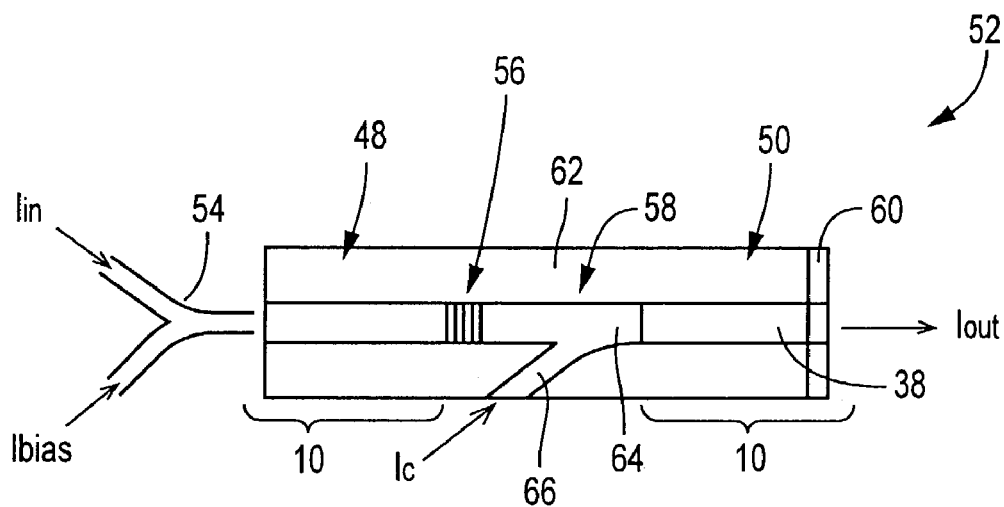
FIG. 8 is a plan view showing an optical function device of three-terminal type in another embodiment of this invention.
Figure 9:
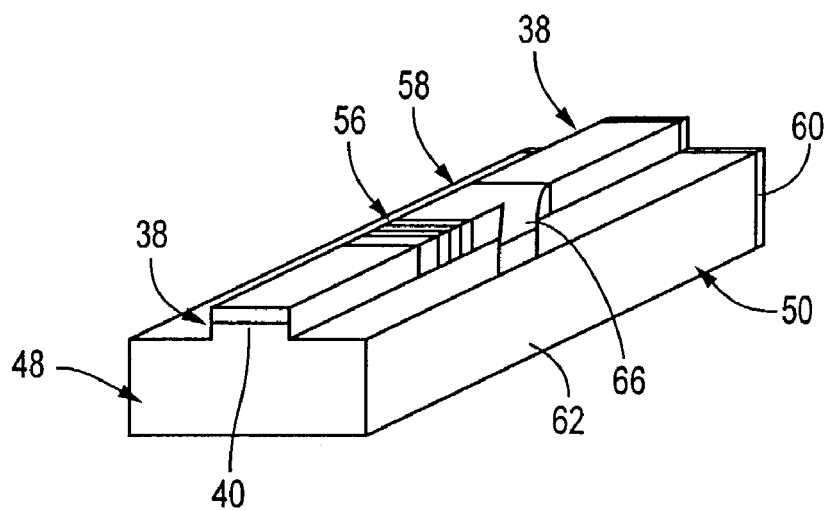
FIG. 9 is a perspective view illustrating an arrangement of the optical function device of the three-terminal type of the embodiment of FIG. 8.

Referring to FIGS. 8 and 9, there is shown an arrangement of the optical function device 52 of three-terminal type, which includes a pair of semiconductor optical amplifying elements 48, 50, each of which is similar to the semiconductor optical amplifying element 26 described above. FIG. 8 is a plan view illustrating the specific arrangement of the optical function device 52 of three-terminal type, while FIG. 9 is a perspective view of the same. In FIGS. 8 and 9, the cap layer and the electrodes are not shown, as in FIG. 2. In the device of FIGS. 8 and 9, a first laser light $L_1$ (first input light $I_{in}$) of a wavelength $\lambda_1$ (1550 nm) and a second laser light L2 (second input light: bias light $I_{bias}$) of a wavelength $\lambda_2$ (1540 nm) are coupled together by an optical coupler 54, and are input to the first semiconductor optical amplifying element 48. From the light output from the first optical amplifying element 48, a light of the wavelength $\lambda_2$ is extracted by a first wavelength extracting element 56. The thus extracted light and a third laser light $L_3$ of the wavelength $\lambda_1$ are coupled together by a second optical coupler 58, and are input to the second semiconductor optical amplifying element 50. From the light output from the second semiconductor optical amplifying element 50, a light of the wavelength $\lambda_1$ is extracted as an output light $L_{out}$ by a second wavelength extracting element 60.

The pair of semiconductor optical amplifying elements 48, 50 are grown on a common substrate 62 of a compound semiconductor such as InP. In the other aspects, each of these elements 48, 50 is identical with the semiconductor optical amplifying element 26 described above. Each semiconductor optical amplifying element 48, 50 includes an optical waveguide 38, and an active layer 40 which provides a pn-junction portion and which is formed within the optical waveguide 38 so as to extend in the wave guiding direction or longitudinal direction of the waveguide 38. An energy to excite the active layer 40 is injected to the active layer 40 by application of an electric current thereto from an external device. Between the optical waveguide 38 of the semiconductor optical amplifying element 48 and the optical waveguide 38 of the semiconductor optical amplifying element 50, there is interposed a waveguide 64 which is formed of a silicon (Si) glass doped with germanium (Ge), or Ge-doped silica. The refractive index of a portion of this waveguide 64 is periodically changed in the wave guiding direction, so that the above-indicated portion provides a grating filter, which functions as the first wavelength extracting element 56. The above-indicated portion of the Ge-doped silica is irradiated with a ultraviolet laser radiation to change the refractive index of that portion periodically in the wave guiding direction, so that the above-indicated grating filter reflects a laser light of the wavelength $\lambda_1$, but permits transmission of a laser light of the wavelength $\lambda_2$.

Like the output light of the semiconductor optical amplifying element 26 described above, the output light of the wavelength $\lambda_2$ of the semiconductor optical amplifying element 48 is partially reflected by the first wavelength extracting element 56, and is again reflected by the input end face of the semiconductor optical amplifying element 48, so that the thus reflected portion of the output light is coupled with the input light. Thus, the output light is subjected to positive feedback.

The waveguide 64 formed of the Ge-doped silica has a cross sectional shape similar to that of the waveguides 38 of the semiconductor optical amplifying elements 48, 50, and is formed in series connection with the waveguides 38 in the longitudinal direction. At a downstream portion of the waveguide 64 in which the first wavelength extracting element 56 is provided, there is formed a Y-shaped branch path 66, so that the third laser light $L_3$ (third input light: control light $I_c$) of the wavelength $\lambda_1$ is introduced through the branch path 66, to be coupled with the light of the wavelength $\lambda_1$ which has passed the first wavelength extracting element 56 and which has not been input to the second semiconductor optical amplifying element 50. The portion of the waveguide 64 at which the branch path 66 is formed corresponds to the second optical coupler 58 described above.

The second wavelength extracting element 60 is constituted by a multi-layered band-pass filter formed of a laminar structure consisting of multiple sets of layers having different refractive index values. This band-pass filter is arranged to inhibit transmission of the second laser light of the wavelength $\lambda_2$ (1540 nm), and permits transmission of the first laser light of the wavelength $\lambda_1$ (1550 nm) while reflecting a predetermined percentage (e.g., 5%) of the first laser light. Accordingly, a portion (5%) of the output light is subjected to the positive feedback to the second semiconductor optical amplifying element 50. Thus, the second wavelength extracting element 60 in the present embodiment functions as an optical feedback element. The portion of the output light returned by the positive feedback is reflected by the first wavelength extracting element 56, to be input again to the second semiconductor optical amplifying element 50.

Figure 10:
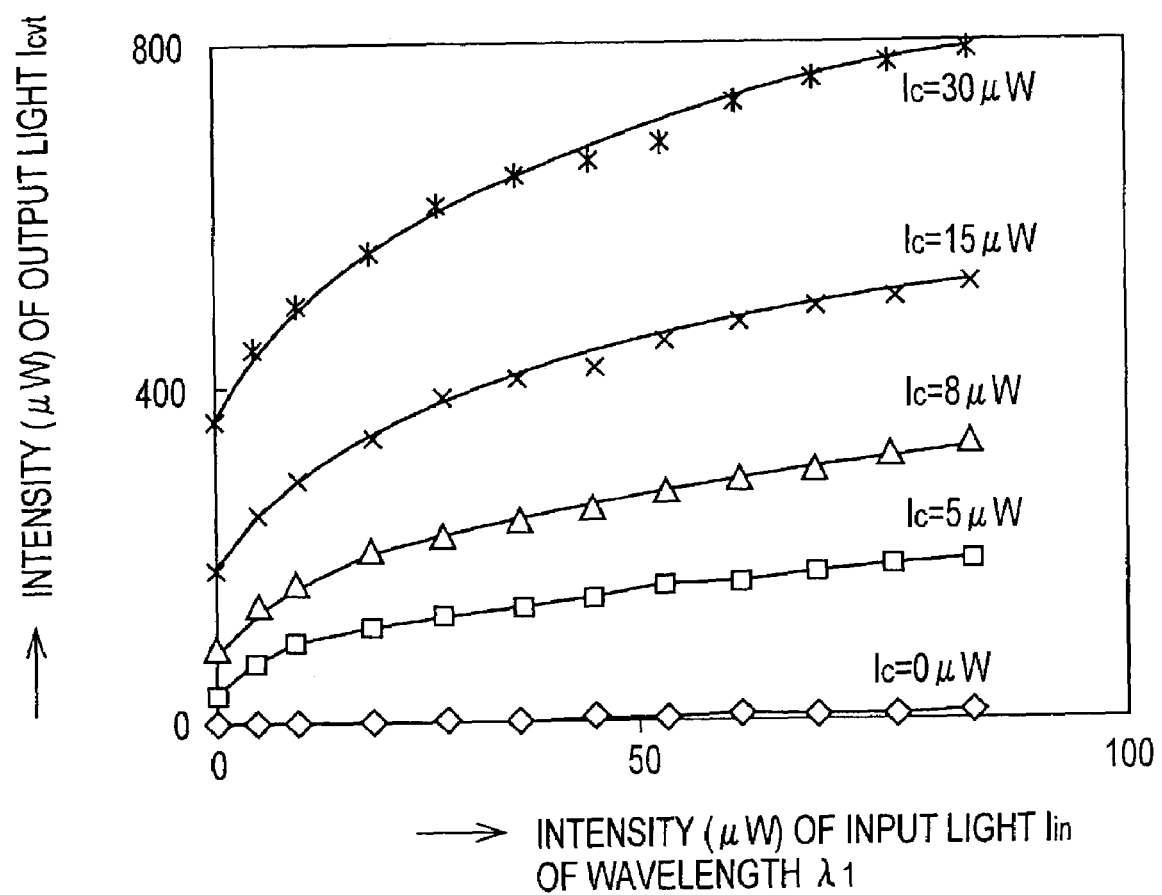
FIG. 10 is a view illustrating control characteristics of an output light in the optical function device of the embodiment of FIG. 1.

In the present embodiment, the modulated input light $I_{in}$ of the wavelength $\lambda_1$ (first laser light $L_1$ of 1550 nm) is coupled with the bias light (second laser light $L_2$) of the wavelength $\lambda_2$ (1540 nm), and the thus coupled lights are input to the first semiconductor optical amplifying element 48, as an input light $I_{in}$. The bias light $I_{bias}$ which has been intensity-modulated in a phase reversed with respect to a variation in the intensity of the input light $I_{in}$ is generated as the output light, and the input light $I_{in}$ is cut by the first wavelength extracting element 56. The control light $I_c$ (third laser light $L_3$) of the wavelength $\lambda_1$ (1550 nm) is coupled with the intensity-modulated bias light $_{Ibias}$ of the wavelength $\lambda_2$ (1540 nm), and the thus coupled lights are input to the second semiconductor optical coupling element 50. As a result, the bias light $I_{bias}$ of the wavelength $\lambda_2$ is again intensity-modulated in a phase reversed with respect to a variation in the intensity of the control light $I_c$ of the wavelength $\lambda_1$ (1550 nm), and is passed through the second wavelength extracting element 60, as the output light. At this time, a portion of the output light $I_{out}$ of the second wavelength extracting element 60 is subjected to the positive feedback, so that the ratio of modulation of the output light $I_{out}$ with respect to the input light is considerably increased. FIG. 10 shows the characteristics of the input and output lights, for different intensity values of the control light $I_c$ used as a parameter. While the intensity of the output light is almost zero where the control light $I_c$ is not coupled with the bias light, the intensity of the output light $I_{out}$ is increased where the control light $I_c$ is coupled with the bias light. This means that the output light $I_{out}$ of the wavelength $\lambda_2$ can be controlled by the control light $I_c$ of the wavelength $\lambda_1$. The optical function device of the present embodiment can be used as a three-terminal optical computing and amplifying device, a three-terminal optical switching device or an optical DEMUX device (demultiplexer device), which is capable of controlling an optical intensity by using one wavelength and which permits multi-stage connection.

In the present embodiment, the output signal light $I_{out}$ has the wavelength equal to the first wavelength $\lambda_1$ of the first laser light $L_1$ (first input light: $I_{in}$), and the intensity which is modulated in phase with the first input light of the first wavelength $\lambda_1$ and amplified with respect to that of the first input light. Accordingly, the present optical function device can be advantageously used in an optical circuit including optical elements connected in multiple stages, since the input and output lights have the same wavelength. Further, the partial positive feedback of the output signal $I_{out}$ to the second semiconductor optical amplifying element 50 is effective to increase the ratio of optical signal modulation and the S/N ratio, permitting stable multi-stage amplification.

Figure 11:
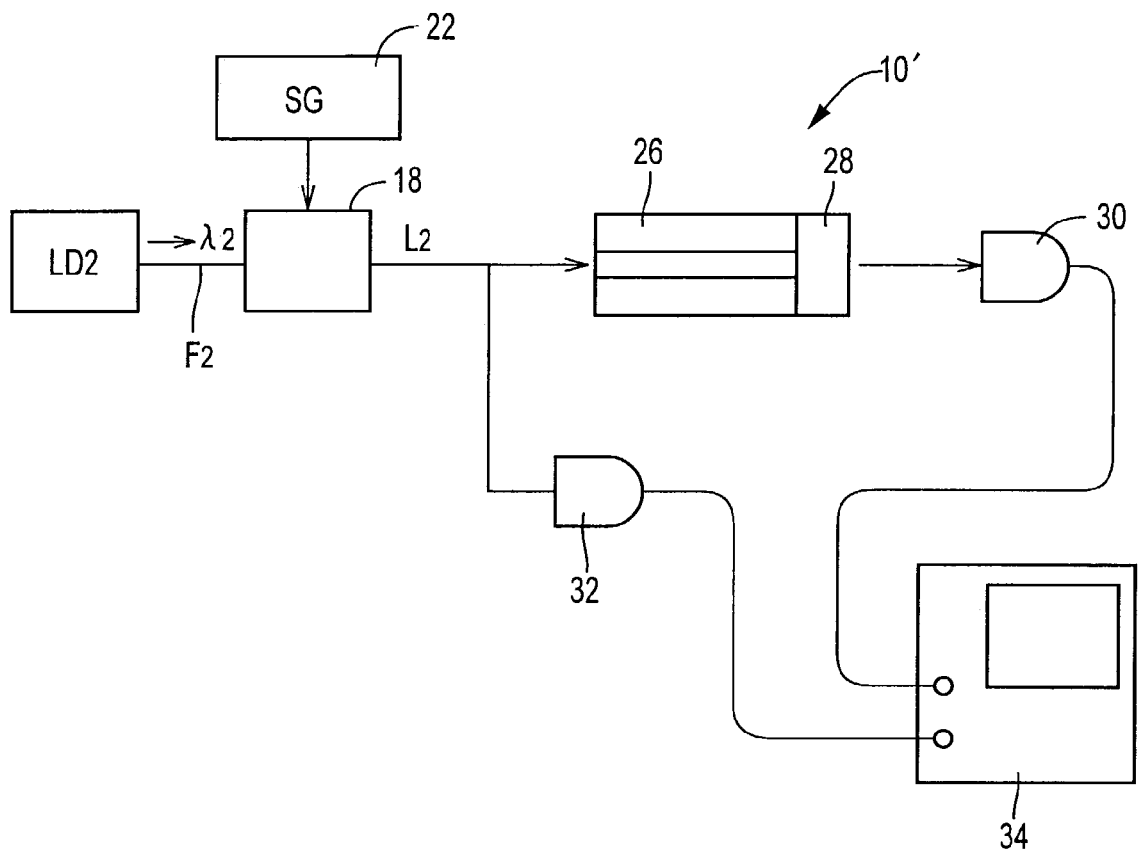
FIG. 11 is a block diagram illustrating an optical function device according to another embodiment of the invention alternative to the embodiment of FIG. 1.

Referring to FIG. 11, there is shown an optical function element 10' wherein a single input laser light $I_{in}$ of a wavelength $\lambda_2$ is input to the semiconductor optical amplifying element 26 of FIG. 1. Like the optical function element 10 in the above-described embodiment, the optical function element 10' of the present embodiment includes the semiconductor optical amplifying element 26 and the wavelength extracting element 28 bonded to the output end face of the element 26. For example, the wavelength extracting element 28 is preferably constituted by a diffraction grating or Bragg reflector formed by a portion (e.g., a surface portion) of an optical waveguide 38, which portion has a refractive index that is periodically changed in the wave guiding direction. In the optical function element 10' of the present embodiment, the input laser light $I_{in}$ of the wavelength $\lambda_2$ is input to the end face of the semiconductor optical amplifying element 26 in its excited state, the intensity of a light within a wavelength band which includes the wavelength $\lambda_2$ and in which the amplifying element 26 provides a gain is modulated in response to a variation in the intensity of the input laser light $I_{in}$ such that the phase of the modulated light is reversed with respect to the input laser light. Further, a portion of the amplified light of the first wavelength $\lambda_1$ is extracted from the wavelength extracting element 28 from the above-indicated wavelength band, and is further amplified by the input end face of the semiconductor optical amplifying element 26 and the output end face of the wavelength extracting element 28, which cooperate to function as an optical resonator and a feedback element. Accordingly, the optical modulation is achieved in the same manner as shown in FIG. 4. When the light of the first wavelength $\lambda_1$ is input to the semiconductor optical amplifying element 26, a spontaneous emission light is generated in a relatively broad wavelength band including the first wavelength $\lambda_1$, as a center wavelength. When the intensity of the light of the first wavelength $\lambda_1$ is increased, the intensity at the center wavelength is increased, but the intensity in the neighboring wavelength band is lowered. The above-indicated wavelength band in which the amplifying element 26 has an amplification gain corresponds to the wavelength band of the spontaneous emission light, that is, the neighboring wavelength band.

Figure 12:
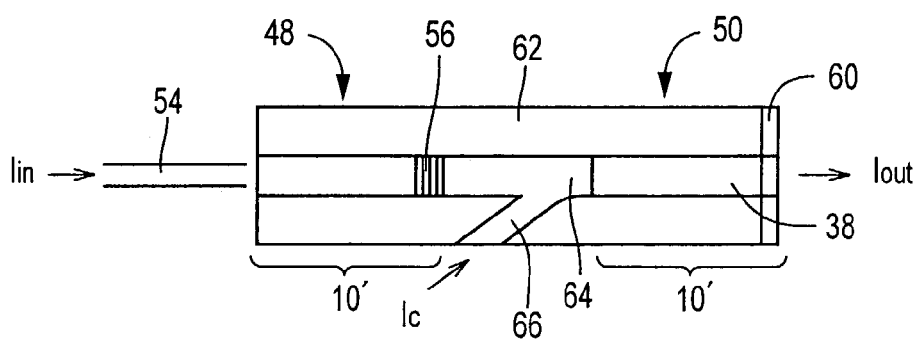
FIG. 12 is a block diagram illustrating an optical function device according to a further embodiment of the invention alternative to the embodiment of FIG. 8.

FIG. 12 shows an optical function device 52' wherein a single input laser light $I_{in}$ of the wavelength $\lambda_1$ is input to the semiconductor optical amplifying element 48, which is located on the input side of the semiconductor optical amplifying element 50, in the optical function device 52 of FIG. 8. In the optical function device 52' of the present embodiment, the input laser light $I_{in}$ of the wavelength $\lambda_1$ is input to the end face of the semiconductor optical amplifying element 48 in its excited state, the intensity of a light within a wavelength band which includes the wavelength $\lambda_1$ and in which the amplifying element 48 provides a gain is modulated in response to a variation in the intensity of the input laser light $I_{in}$ such that the phase of the modulated light is reversed with respect to the input laser light. Further, a portion of the amplified light of the second wavelength $\lambda_2$ is extracted from the wavelength extracting element 56 from the above-indicated wavelength band, and is further amplified by the input end face of the semiconductor optical amplifying element 48 and the output end face of the wavelength extracting element 56, which cooperate to function as an optical resonator and a feedback element. The control light $I_c$ of the wavelength $\lambda_3$ (third wavelength) is coupled with the thus amplified laser light of the wavelength $\lambda_2$ by the optical coupler 58, and the coupled lights are input to the second semiconductor optical amplifying element 50. A light of the second wavelength is extracted as the output light $I_{out}$ by the second wavelength extracting element 60 from the output of the second semiconductor optical amplifying element 50.

Figure 13:
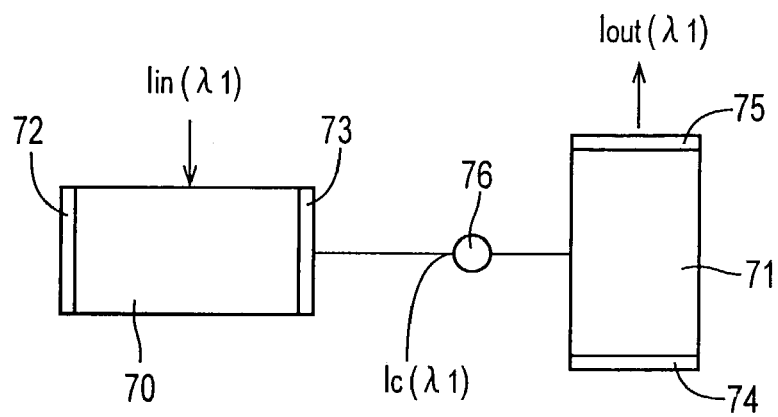
FIG. 13 is a view illustrating an arrangement of an optical function device according to another embodiment of this invention.
Figure 14:
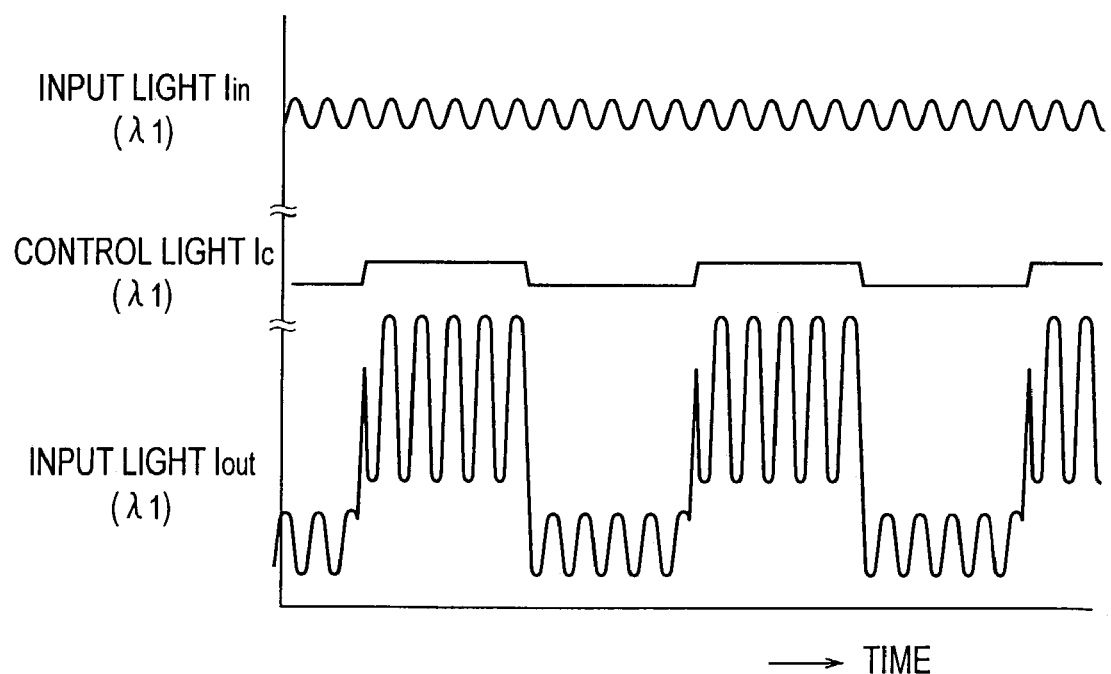
FIG. 14 is a time chart for explaining an operation of the optical function device of the embodiment of FIG. 13.

FIG. 13 shows an optical function device according to a further embodiment of this invention. The optical function device of this embodiment includes a semiconductor optical amplifying element 70 which is similar to the above-described semiconductor optical amplifying element 27, 48, 50 and which is provided at its opposite end faces with an optical feedback element 72 and a wavelength extracting element 73 (also serving as an optical feedback element), which cooperate with each other to constitute an optical resonator to which an input light $I_{in}$ (first wavelength $\lambda_1$) is input. The present optical function device further includes a semiconductor optical amplifying element 71 which is also similar to the above-described semiconductor optical amplifying element 27, 48, 50 and which is provided at its opposite end faces with an optical feedback element 74 and a wavelength extracting element 75 (also serving as an optical feedback element), which cooperate with each other to constitute an optical resonator to which an input light $I_{in}$ (first wavelength $\lambda_1$) in the form of the output light of the semiconductor optical amplifying element 70 is input. The modulated input light $I_{in}$ (first wavelength $\lambda_1$) is input to the optical resonator of the semiconductor optical amplifying element 70 similar to the above-indicated semiconductor optical amplifying element 26, and a light of the second wavelength $\lambda_2$ generated within the semiconductor optical amplifying element 70 in its excited state is extracted by the wavelength extracting element 73 similar to the above-indicated wavelength extracting element 28, 56, 60, and is selectively amplified by the pair of optical feedback elements 72, 73 which function as the optical resonator. The thus amplified laser light of the second wavelength $\lambda_2$ is intensity-modulated in a phase reversed with respect to the modulated input light $I_{in}$. The control light $I_c$ of the first wavelength $\lambda_1$ is coupled by an optical coupler 76 with the laser light of the second wavelength $\lambda_2$, and the thus coupled lights are input to the next-stage semiconductor optical amplifying element 71 in its excited state. A light of the wavelength $\lambda_1$ extracted by the wavelength extracting element 75 similar to the above-indicated wavelength extracting element 72 is selectively amplified by the pair of optical feedback elements 74, 75 which function as the optical resonator. The thus amplified laser light of the wavelength $\lambda_1$ is modulated by the control light $I_c$, and the thus modulated laser light is obtained as the output light. FIG. 14 illustrates the waveforms of the input light $I_{in}$, control light $I_c$ and output light $I_{out}$ in the optical function device of FIG.

13. The waveform of the output light $I_{out}$ is considerably amplified with respect to that of the input light, and is controlled by the intensity-modulated control light $I_c$ of the wavelength $\lambda_1$.

Figure 15:
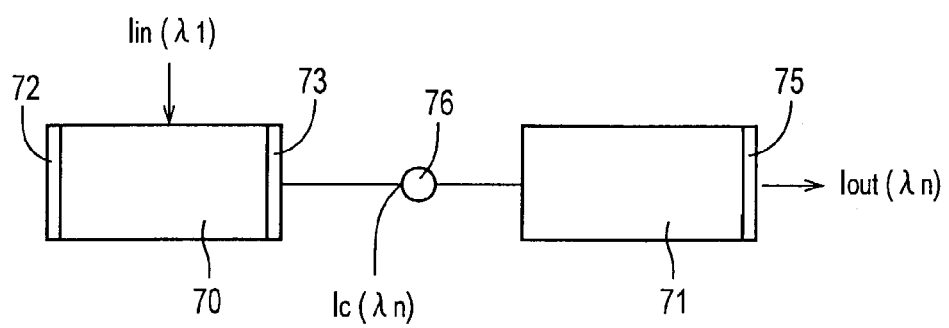
FIG. 15 is a view illustrating an arrangement of an optical function device in a further embodiment of this invention.

FIG. 15 shows an optical function device according to another embodiment of this invention. The optical function device of this embodiment includes the semiconductor optical amplifying element 70 which is provided at its opposite end faces with the optical feedback element 72 and the wavelength extracting element 73 (also serving as the optical feedback element), which cooperate with each other to constitute the optical resonator to which the input light $I_{in}$ (first wavelength $\lambda_1$) is input. The present optical function device further includes a semiconductor optical amplifying element 71 of traveling-wave type which receives an input light through one end face thereof and which is provided at the other end face with the wavelength extracting element 75. The modulated input light $I_{in}$ (first wavelength $\lambda_1$) is input to the optical resonator of the semiconductor optical amplifying element 70, and a light of the second wavelength $\lambda_2$ generated within the semiconductor optical amplifying element 70 in its excited state is extracted by the wavelength extracting element 73 similar to the above-indicated wavelength extracting element 28, 56, 60, and is selectively amplified by the pair of optical feedback elements 72, 73 which function as the optical resonator. The thus amplified laser light of the second wavelength $\lambda_2$ is intensity-modulated in a phase reversed with respect to the modulated input light $I_{in}$. The control light $I_c$ of the first wavelength $\lambda_1$ is coupled by an optical coupler 76 with the laser light of the second wavelength $\lambda_2$, and the thus coupled lights are input to the above-indicated one end face of the next-stage semiconductor optical amplifying element 71 in its excited state. A light of the wavelength $\lambda_n$ extracted by the wavelength extracting element 75 and selectively amplified is obtained as the output light from the semiconductor optical amplifying element 75. The optical function device of the present embodiment functions as a multi-terminal wavelength converting element operable to convert the first wavelength $\lambda_1$ to the desired wavelength $\lambda_n$, by suitably selecting the wavelength $\lambda_n$ of the control light Ic and the wavelength $\lambda_n$ to be extracted by the wavelength extracting element 75.

Figure 16:
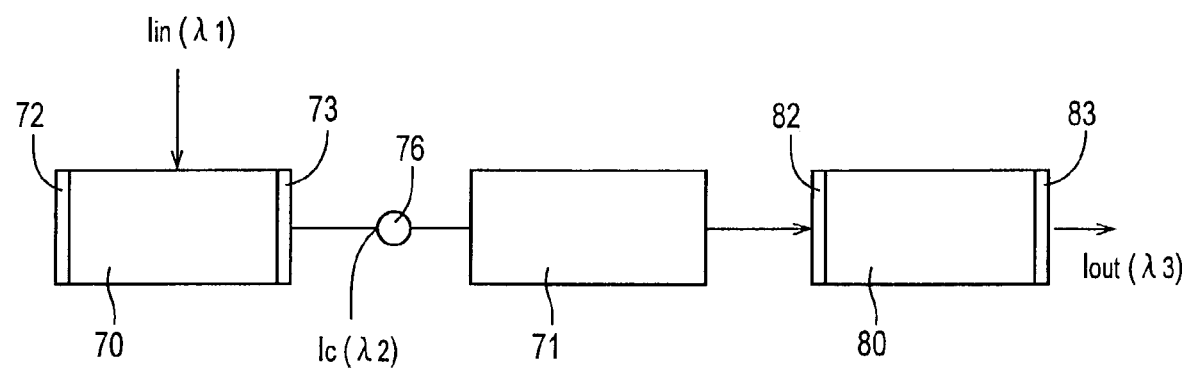
FIG. 16 is a view illustrating an arrangement of an optical function device according to a still further embodiment of the present invention.
Figure 17:
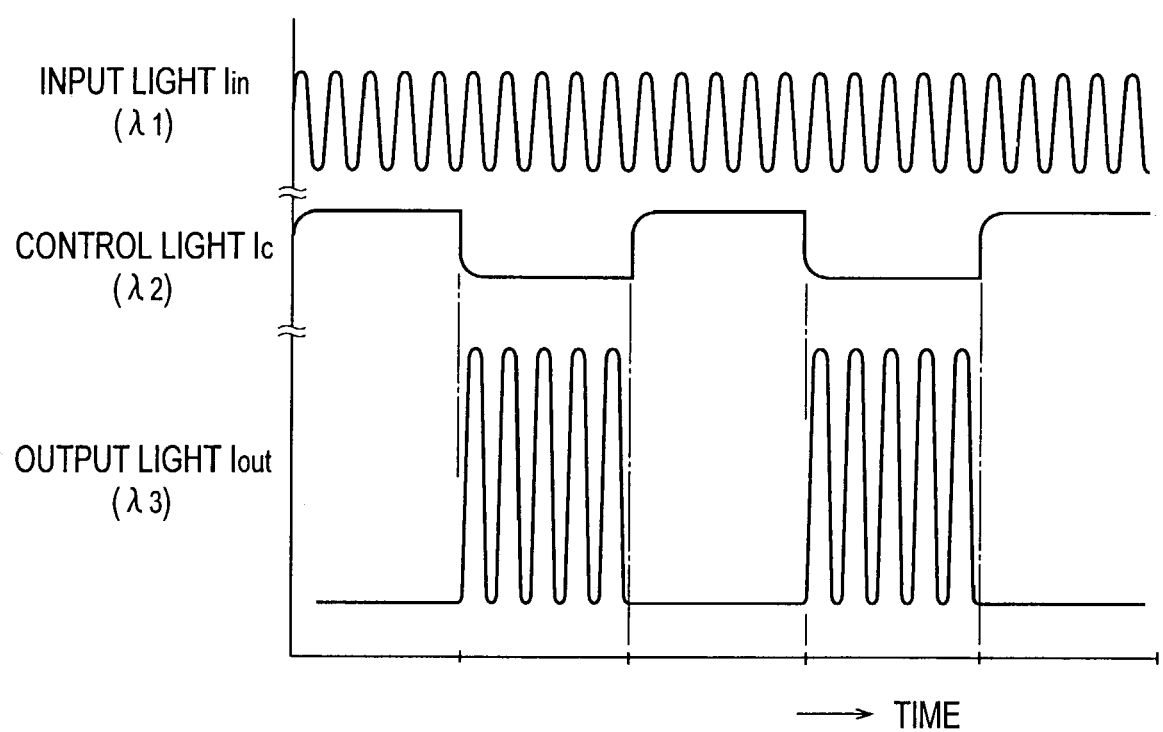
FIG. 17 is a time chart for explaining an operation of the optical function device of the embodiment of FIG. 16.

FIG. 16 shows an optical function device according to a further embodiment of this invention. The optical function device of this embodiment includes the semiconductor optical amplifying element 70 which is provided at its opposite end faces with the optical feedback element 72 and the wavelength extracting element 73 (also serving as the optical feedback element), which cooperate with each other to constitute the optical resonator to which the input light $I_{in}$ (first wavelength $\lambda_1$) is input. The present optical function device further includes a semiconductor optical amplifying element 71 of traveling-wave type not provided at its opposite end faces with an optical feedback element and a wavelength extracting element, 75 (also serving as an optical feedback element), and a semiconductor optical amplifying element 80 which is provided at its opposite end faces with an optical feedback element 82 and a wavelength extracting element 83 and which receives an input light through the optical feedback element 82 at its input end face. The modulated input light $I_{in}$ (first wavelength $\lambda_1$) is input to the optical resonator of the semiconductor optical amplifying element 70, and a light of the second wavelength $\lambda_2$ generated within the semiconductor optical amplifying element 70 in its excited state is extracted by the wavelength extracting element 73 similar to the above-indicated wavelength extracting element 28, 56, 60, and is selectively amplified by the pair of optical feedback elements 72, 73 which function as the optical resonator. The thus amplified laser light of the second wavelength $\lambda_2$ is intensity-modulated in a phase reversed with respect to the modulated input light $I_{in}$. The control light $I_c$ of the second wavelength $\lambda_2$ is coupled by the optical coupler 76 with the laser light of the wavelength $\lambda_2$, and the thus coupled lights are input to the above-indicated one end face of the next-stage semiconductor optical amplifying element 71 in its excited state. An amplified output light of the wavelength $\lambda_2$ is output from the semiconductor optical amplifying element 71. The output light of the wavelength $\lambda_2$ is then input to the semiconductor optical amplifying element 80 in its excited state, and a light of the wavelength $\lambda_3$ extracted by the wavelength extracting element 83 is selectively amplified by the pair of optical feedback elements 82, 83 which function as the optical resonator. The thus amplified light is modulated by the control light $I_c$ of the wavelength $\lambda_2$. The wavelength $\lambda_3$ may be equal to the wavelength $\lambda_1$ ($\lambda_3=\lambda_1$). The optical function device of the present embodiment may be used as a three-terminal optical computing and amplifying device, a three-terminal optical switching device, or an optical demultiplexer device. However, an optical coupler may be provided between the semiconductor optical amplifying element 71 and the semiconductor optical amplifying element 80, so that a second control light $I_{c2}$ of a wavelength $\lambda_3$, for example, is coupled with the output light of the semiconductor optical amplifying element 71. In this case, the optical function device can function as a multiple-terminal (four-terminal) wavelength converting device or a multiple-terminal optical signal processing device. FIG. 17 is a time chart for explaining an operation of the optical function device of the present embodiment. The time chart illustrates the waveforms of the input light $I_{in}$, control light $I_c$ and output light $I_{out}$ in the optical function device of FIG. 13. It will be understood from FIG. 17 that the output light $I_{out}$ is turned on and off by the control light $I_c$.

While the embodiments of this invention have been described above by reference to the drawings, it is to be understood that the present invention may be otherwise embodied.

For instance, each of the wavelength extracting element 28, first wavelength extracting element 56 and second wavelength extracting element 60 may be constituted by any one of: a grating filter formed by a portion (for example, a surface portion) of the optical waveguide, which portion has a refractive index that is periodically changed in the wave guiding direction; a multi-layered filter which is a laminar structure consisting of multiple sets of layers which have respective different refractive index values; a light absorbing material; and a photonic crystal having a photonic band gap.

Even where the first wavelength extracting element 56 and the second wavelength extracting element 60 function as optical feedback elements, each of these elements 56, 60 may be constituted by any one of: the grating filter formed by a portion (for example, a surface portion) of the optical waveguide, which portion has a refractive index that is periodically changed in the wave guiding direction; the multi-layered filter which is a laminar structure consisting of multiple sets of layers which have respective different refractive index values; the light absorbing material; the photonic crystal having a photonic band gap; and a reflection reducing layer operable to reflect a portion of the input light.

In the embodiment of FIG. 1 through FIG. 3, the second input light $L_2$ of the wavelength $\lambda_2$ is modulated, and the first input light $L_1$ of the wavelength $\lambda_1$ is a continuous light. However, the second output light $L_2$ of the wavelength $\lambda_2$ may be a continuous light modulated, and the first input light $L_1$ of the wavelength $\lambda_1$ may be modulated.

While the semiconductor optical amplifying elements 48, 50 in the embodiment of FIGS. 8 and 9 are formed on the common compound semiconductor substrate 62, these amplifying elements may be formed on respective separate substrates.

Further, the above-indicated semiconductor optical amplifying elements 26, 48, 50 may be provided with an optical feedback circuit in the form of an optical fiber arranged to return a portion of the output light $I_{out}$ back to the input end. In this case, the optical fiber corresponds to the positive feedback element.

It is to be understood that the embodiments of the present invention have been described above for illustrative purpose only, and that various changes may be made in the present invention, without departing from the principle of the invention.

The invention claimed is:

1. An optical function element comprising:
a semiconductor optical amplifying element configured to receive only an input laser light of a first wavelength, and intensity-modulate a light having a wavelength within a wavelength band which includes said first wavelength of said input laser light and in which said semiconductor optical amplifying element has an amplification gain, such that said light having the wavelength within said wavelength band is intensity-modulated in response to a variation in an intensity of said input light; in a phase reversed with respect to said input laser light;
an optical feedback element configured to effect positive feedback of a portion of an output to said optical amplifying element to said optical amplifying element; and a wavelength extracting element operable to extract a light of a second wavelength from a light generated within said optical amplifying element, to output an output light of said second wavelength.

2. An optical function element according to claim 1, wherein said semiconductor optical amplifying element includes an optical waveguide for guiding said laser light, and an active layer formed within said optical waveguide so as to extend in a wave guiding direction, and is arranged to receive an energy to excite said active layer.

3. An optical function element according to claim 2, wherein said active layer is constituted by one of a quantum well, a strained superlattice and a quantum dot.

4. An optical function element according to claim 1, wherein said waveguide extracting element is constituted by any one of a grating filter formed by a portion of an optical waveguide constructed to guide the output light of said semiconductor optical amplifying element, which portion has a refractive index that is periodically changed in a wave guiding direction; a multi-layered filter which is a laminar structure consisting of multiple sets of layers which have respective different refractive index values; a light absorbing material; and a photonic crystal having a photonic band gap.

5. An optical function element according to claim 1, wherein said optical feedback element is constituted by any one of a grating filter formed by a portion of an optical waveguide constructed to guide the output light of said semiconductor optical amplifying element, which portion has a refractive index that is periodically changed in a wave guiding direction; a multi-layered filter which is a laminar structure consisting of multiple sets of layers which have respective different refractive index values; a photonic crystal having a photonic band gap; and a layer to reduce light reflection from an output end face of said waveguide extracting element.

6. An optical function device comprising a plurality of optical function elements according to claim 1 which are connected in series with each other, and an optical coupler configured to couple together an output light of an upstream one of two successive optical function elements of said plurality of optical function elements and an input laser light having a wavelength equal to or different from the wavelength of said output light, and input the coupled output light and input laser light to the other of said two successive optical function element.

7. A method of using an optical function device according to claim 6, comprising a step of inputting an input laser light to said optical function device to perform one of a three-terminal optical computing and amplifying operation, a three-terminal optical switching operation, and an optical demultiplexer operation.

8. A method of using an optical function device according to claim 6, comprising a step of inputting an input laser light to said optical function device to perform a multiple-terminal signal processing operation or a multiple-terminal wave converting operation.

9. An optical function device comprising:
an optical function element according to claim 1;
an optical coupler configured to couple together an output light of said optical function element and an output laser light having a wavelength equal to or different from the wavelength of said output light of said optical function element;
a semiconductor optical amplifying element of traveling-wave type configured to receive said output light and said input laser light which have been received by said optical coupler; and
a wavelength extracting element configured to extract the wavelength of said input laser light, to output an output light.

10. An optical function device comprising an optical function device according to claim 9, and an optical function element according to claim 1 disposed on an output side of said optical function device.

11. A method of using an optical function device according to claim 9, comprising a step of inputting an input laser light to said optical function device to perform one of a three-terminal optical computing and amplifying operation, a three-terminal optical switching operation and an optical demultiplexing operation.

12. A method of using an optical function device according to claim 9, comprising a step of inputting an input laser light to said optical function device to perform a multiple-terminal signal processing operation or a multiple-terminal wave converting operation.

13. An optical function element according to claim 1, wherein the second wavelength is not the wavelength of the input laser light.

* * * * *